United States Patent
Ito et al.

(10) Patent No.: US 8,062,086 B2
(45) Date of Patent: Nov. 22, 2011

(54) METHOD OF MANUFACTURING ORGANIC EL PANEL, ORGANIC EL PANEL, AND ELECTRONIC APPARATUS

(75) Inventors: Masaki Ito, Suwa (JP); Shotaro Watanabe, Chino (JP)

(73) Assignee: Seiko Epson Corporation, Tokyo (JP)

( * ) Notice: Subject to any disclaimer, the term of this patent is extended or adjusted under 35 U.S.C. 154(b) by 319 days.

(21) Appl. No.: 12/414,040

(22) Filed: Mar. 30, 2009

(65) Prior Publication Data
US 2009/0253336 A1 Oct. 8, 2009

(30) Foreign Application Priority Data
Apr. 7, 2008 (JP) ................................. 2008-099069

(51) Int. Cl.
*H01J 9/00* (2006.01)
*H01J 9/24* (2006.01)
(52) U.S. Cl. .............. 445/24; 445/58; 427/66; 427/271; 427/287
(58) Field of Classification Search .................. 313/504; 445/24, 58; 427/66, 282, 287, 271
See application file for complete search history.

(56) References Cited

U.S. PATENT DOCUMENTS

| 6,768,259 B2 * | 7/2004 | Hirano | 313/506 |
| 7,431,626 B2 * | 10/2008 | Lee et al. | 445/24 |
| 2004/0161632 A1 * | 8/2004 | Seo et al. | 428/690 |
| 2009/0184636 A1 * | 7/2009 | Cok | 313/505 |

FOREIGN PATENT DOCUMENTS

JP A-2000-133443 5/2000
* cited by examiner

*Primary Examiner* — Nimeshkumar Patel
*Assistant Examiner* — Glenn Zimmerman
(74) *Attorney, Agent, or Firm* — Oliff & Berridge, PLC

(57) ABSTRACT

There is provided a method of manufacturing an organic EL panel by using a mask that includes a blocking portion blocking incoming particles and a plurality of opening portions through which the incoming particles can pass. The method includes forming a first light emitting part corresponding to a first color on a substrate by using a first mask, forming a first electrode that is overlapped with the first light emitting part by using the first mask, forming a second light emitting part corresponding to a second color on the substrate next to the first light emitting part so as to cover at least a part of the first electrode by using a second mask, forming a third light emitting part corresponding to a third color on the substrate in a position for facing the second light emitting part with the first electrode interposed therebetween in the plan view so as to cover at least a part of the first electrode or the second light emitting part, by using a third mask, forming a second electrode in an area corresponding to the second light emitting part and the third light emitting part by using a fourth mask, and removing a material that is deposited on the first electrode and the second electrode by using the first electrode and the second electrode as a mask.

8 Claims, 6 Drawing Sheets

METHOD OF MANUFACTURING ORGANIC EL PANEL, ORGANIC EL PANEL, AND ELECTRONIC APPARATUS

BACKGROUND

1. Technical Field

The present invention relates to a method of manufacturing an organic EL panel, an organic EL panel, and an electronic apparatus.

2. Related Art

Organic EL panels have a wide viewing angle, compared to liquid crystal panels. In addition, since organic EL elements that configure the organic EL panels are elements that directly emit light, the organic EL panels have superior capability of black representation, compared to the liquid crystal panels and are evaluated highly as next-generation display panels. Since the organic EL panel can emit light of three primary colors including RGB (R: red color, G: green color, and B: blue color) by changing the configuration of an organic function layer, the organic EL panels have been developed as displays for color display.

As a method of forming an organic function layer on a substrate, technology in which a same shape as an opening portion of an evaporation mask is transferred using an evaporation mask to the substrate by using a vapor deposition method for a case where a low-molecular material having high heat resistance has been known.

In order to configure the organic EL panel to have a higher-precision image quality, a unit pixel is needed to be set to be small. Accordingly, technology for miniaturizing RGB pixels as sub pixels of the unit pixel has been researched. In particular, as shown in JP-A-2000-133443, by using an evaporation mask that can implement miniaturization, an evaporation mask having a microscopic pattern for acquiring high-precision image quality can be acquired.

In addition, in order to improve brightness of the organic EL panel, each sub pixel is needed to emit light at higher brightness, and thus, technology for improving the brightness by driving each sub pixel using a higher driving current has been used.

The deterioration characteristics of RGB pixels for a case where the pixels are driven by using a high driving current are different for the colors, and particularly, the pixel life cycle of B (blue color) is shortened at the current time point. In order to complement this defect, technology for lengthening the life cycle of the organic EL panel by decreasing brightness per each unit area by setting the pixel dimension of B larger than the pixel dimensions of G (green color) and R (red color) has been known.

However, to form an evaporation mask having a microscopic pattern needs a high degree of technology. Accordingly, it is difficult to provide the evaporation mask at a high yield ratio. In addition, when a microscopic opening portion is formed, evaporation particles incoming from the inclination direction in an evaporation process may be caught by the evaporation mask. Thus, there is a problem that the evaporation efficiency is decreased. In addition, for a case where the thickness of the evaporation mask is decreased so as to utilize the particles incoming from the inclination direction, there is a problem that the strength of the evaporation mask is decreased.

In addition, the adjustment precision of the evaporation mask having a microscopic pattern requires a high degree of precision. Thus, there is a problem that a defective product is manufactured even for a case where slight misalignment occurs.

SUMMARY

An advantage of some aspects of the invention is that it provides a method of manufacturing an organic EL panel, an organic EL panel, and an electronic apparatus. The invention may be implemented in the following forms or applied examples.

APPLIED EXAMPLE 1

According to Applied Example 1, there is provided a method of manufacturing an organic EL panel by using a mask that includes a blocking portion blocking incoming particles and a plurality of opening portions through which the incoming particles can pass. The method includes: forming a first light emitting part corresponding to a first color on a substrate by using a first mask; forming a first electrode that is overlapped with the first light emitting part by using the first mask; forming a second light emitting part corresponding to a second color on the substrate next to the first light emitting part so as to cover at least a part of the first electrode by using a second mask; forming a third light emitting part corresponding to a third color on the substrate in a position for facing the second light emitting part with the first electrode interposed therebetween in the plan view so as to cover at least a part of the first electrode or the second light emitting part, by using a third mask; forming a second electrode in an area corresponding to the second light emitting part and the third light emitting part by using a fourth mask; and removing a material that is deposited on the first electrode and the second electrode by using the first electrode and the second electrode as a mask.

According to the above described applied example, at least a partial area of the second light emitting part is formed to be disposed on the first electrode. Accordingly, the area of the light emitting area of the second light emitting part can be configured to be smaller than that of the second mask. In other words, the opening portion of the second mask can be configured to be larger than the second light emitting part. By using a mask having a large opening portion, incoming particles flying from the inclination direction can be used for forming a layer with high efficiency.

In addition, even when misalignment occurs, only the dimension of the second light emitting part and the dimension of the third light emitting part vary. Accordingly, correction can be made by adjusting the chromaticity that is performed after manufacture. In addition, a manufacturing method that can relieve the effect of misalignment can be provided.

APPLIED EXAMPLE 2

According to Applied Example 2, in the method of manufacturing an organic EL panel according to the above-described applied example, after removing of the material, a conductive body layer is formed in a superimposing manner so as to cover the first electrode and the second electrode.

According to the above-described applied example, a structure in which metal is disposed on the entire surface layer can be formed by superimposing a conductive body. Accordingly, it is possible to use a layout of a general pattern in a state a wiring pattern is created.

APPLIED EXAMPLE 3

According to Applied Example 3, in the method of manufacturing an organic EL panel according to the above-described applied example, it is configured that the first light emitting part, the second light emitting part, and the third light emitting part have a shape that has a longitudinal direction and a lateral direction in the plan view, and the first light emitting part, the second light emitting part, and the third light emitting part are arranged in the lateral direction.

According to the above-described applied example, the shape of a pixel that is configured by the first light emitting part, the second light emitting part, and the third light emitting part can be formed close to a rectangle. Accordingly, a method of manufacturing an organic EL panel having small distortion in the vertical and horizontal directions can be provided.

APPLIED EXAMPLE 4

According to Applied Example 4, in the method of manufacturing an organic EL panel according to the above-described applied example, it is configured that the width of the first light emitting part is larger than both widths of the second light emitting part and the third light emitting part in a case where the lateral direction is assumed to be the widthwise direction.

According to the above-described applied example, the organic EL elements configuring the organic EL panel have different life cycles for light emission colors at the current state. Thus, the life cycle of the organic EL panel ends at a time point when an organic EL element that has the shortest life cycle deteriorates. On the other hand, the life cycle of the organic EL element is strongly dependent upon a light output per unit area. Accordingly, it is possible to lengthen the life cycle of the organic EL element by decreasing the light output per unit area. Thus, by broadening the width of an organic EL element having a light emitting part corresponding to a color of the shortest life cycle, light intensity per unit area can be decreased without decreasing the light output. Therefore, it is possible to lengthen the life cycle of the organic EL panel.

APPLIED EXAMPLE 5

According to Applied Example 5, in the method of manufacturing an organic EL panel according to the above-described applied example, the first mask, the second mask, and the third mask are masks that are formed as a same mask or formed by assorting dimensions thereof.

According to the above-described applied example, by using the mask for a plurality of processes, the operating rate of the mask is increased. Thus, the cost depreciation of the mask can be performed in a short period. In addition, spare masks may be acquired only for types of a small number, and accordingly, stock management of the masks can be performed in an easy manner.

APPLIED EXAMPLE 6

According to Applied Example 6, in the method of manufacturing an organic EL panel according to the above-described applied example, at least one between the second mask and the third mask has a width of an opening portion that is broader than that of the first mask in a case where the lateral direction is assumed to be the widthwise direction.

According to the above-described applied example, at least one between the second mask and the third mask has a width of an opening portion that is larger than that of the first mask. Accordingly, when a width close to the pattern width of the first mask is formed, alignment thereof can be performed in an easy manner.

APPLIED EXAMPLE 7

According to Applied Example 7, in the method of manufacturing an organic EL panel according to the above-described applied example, the removing of the material is performed by ashing using noble gas.

According to the above-described applied example, by performing ashing in the atmosphere of noble gas, a selection ratio with respect to the electrode layer can be improved. In addition, a damage of the electrode layer can be suppressed.

APPLIED EXAMPLE 8

According to Applied Example 8, in the method of manufacturing an organic EL panel according to the above-described applied example, at least one between the second mask and the third mask performs alignment by correcting a dimensional variation due to a material attached to an end portion of the mask.

According to the above-described applied example, a process in which a layer is formed by shifting the position for correcting the dimensional variation due to attachment of a layer forming material is used. Thus, even when the layer forming particles are attached to the evaporation mask, the dimensional precision can be maintained, and accordingly, the frequency of performing a cleaning process can be decreased. Therefore, the operating rate of the mask can be improved.

APPLIED EXAMPLE 9

According to Applied Example 9, there is provided an organic EL panel that is formed by using the above-described method.

According to the above-described applied example, by using the above-described manufacturing method, a microscopic pattern can be formed. Therefore, it is possible to provide an organic EL panel having a high-precision display quality level can be provided.

APPLIED EXAMPLE 10

According to Applied Example 10, there is provided an electronic apparatus that uses the above-described organic EL panel.

According to the above-described applied example, the above-described organic EL element is used. Therefore, an electronic apparatus having a high-precision display quality level can be acquired.

BRIEF DESCRIPTION OF THE DRAWINGS

The invention will be described with reference to the accompanying drawings, wherein like numbers reference like elements.

DESCRIPTION OF EXEMPLARY EMBODIMENTS

Configuration of Organic EL Panel

Figure 1:
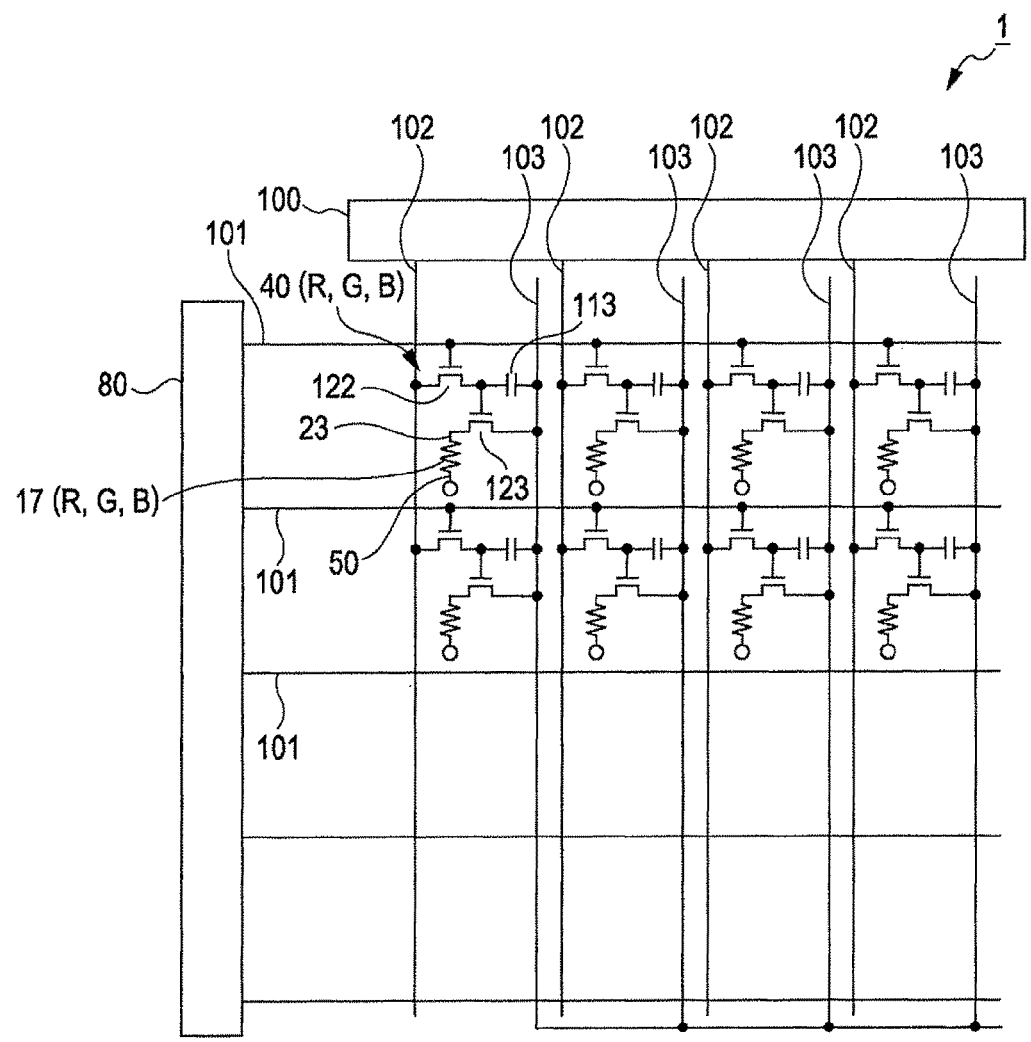
FIG. 1 is a schematic diagram showing a wiring structure of an organic EL panel according to an embodiment of the invention.

Hereinafter, an organic EL panel according to an embodiment of the invention will be described with reference to the accompanying drawings. FIG. 1 is a schematic diagram showing a wiring structure of the organic EL panel according to this embodiment. This organic EL panel 1 is an active matrix type that uses a thin film transistor (hereinafter, referred to as a TFT) as a switching element. The organic EL panel 1 has a wiring configuration in which a plurality of scanning lines 101, a plurality of signal lines 102 that extend in a direction for intersecting the scanning lines 101, and a plurality of power source lines 103 that extend in parallel with the signal lines 102. In addition, pixels (sub pixels 40) are disposed near intersections of the scanning lines 101 and the signal lines 102.

To the signal lines 102, a data line driving circuit 100 that has a shift register, a level shifter, a video line, and an analog switch is connected. In addition, to the scanning lines 101, a scanning line driving circuit 80 that has a shift register and a level shifter is connected.

Each sub pixel 40 includes a switching TFT 122 having a gate electrode to which a scanning signal is supplied through the scanning line 101 and a holding capacitor 113 that maintains a pixel signal that is shared with the signal line 102 through the switching TFT 122. In addition, the sub pixel 40 includes a driving TFT 123 having a gate electrode to which the pixel signal that is maintained by the holding capacitor 113 is supplied, a pixel electrode 23 to which a driving current is supplied from the power source line 103 for a case where the pixel electrode 23 is electrically connected to the power source line 103 through the driving TFT 123, and an organic EL element 17 (R(red), R(green), or B (blue)) that is pinched between the pixel the pixel electrode 23 and an opposing electrode 50 facing the pixel electrode 23.

Next, a detailed form of the organic EL panel 1 according to this embodiment will be described with reference to FIG. 2. Here, FIG. 2 is a schematic plan view showing the configuration of the organic EL panel 1.

Figure 2:
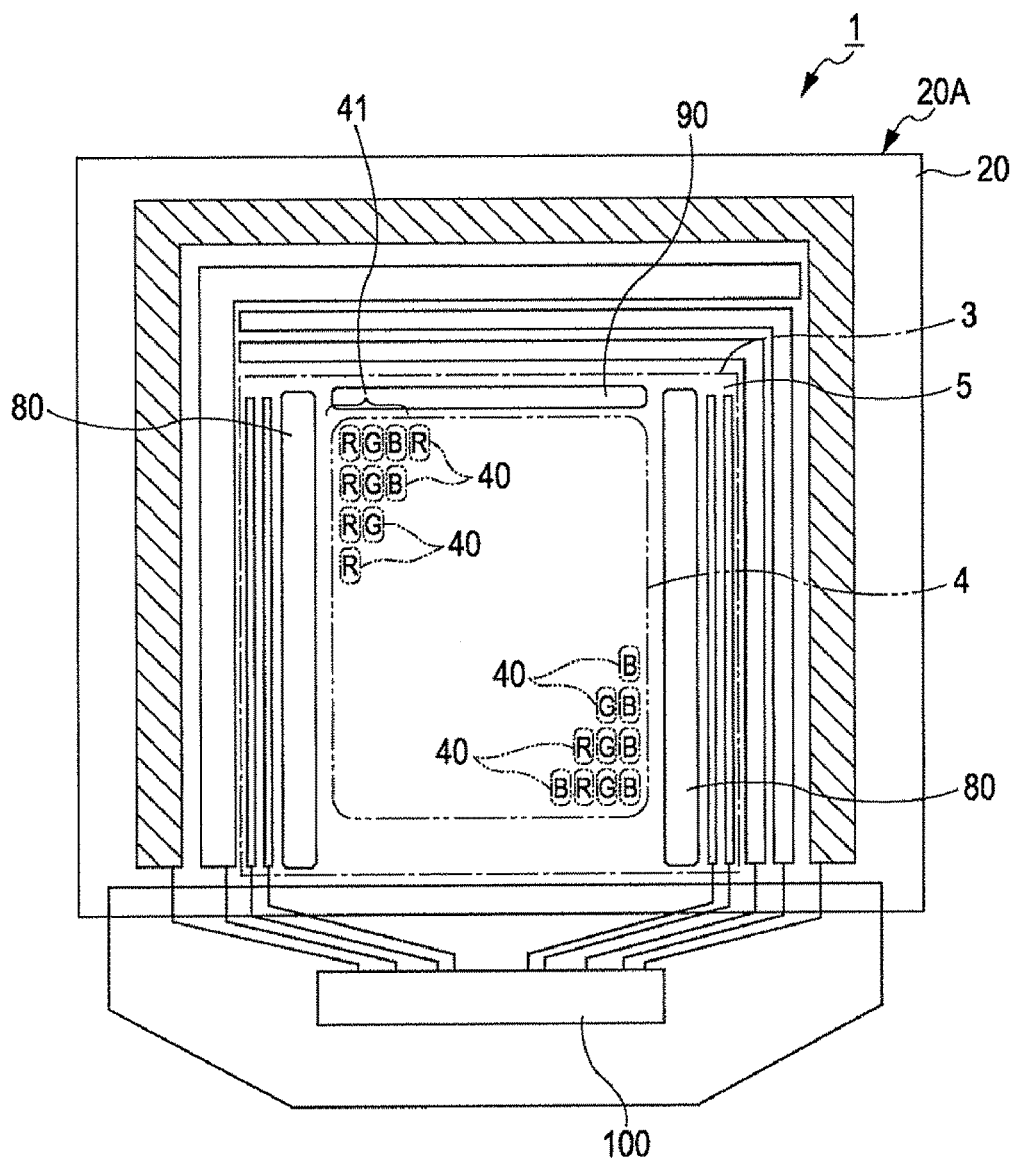
FIG. 2 is a schematic plan view showing the configuration of the organic EL panel.

As shown in FIG. 2, in an actual display area 4 located on the substrate 20, the sub pixels 40 that are disposed in correspondence with the colors R, G, and B are regularly disposed in a matrix pattern. The sub pixels 40 (R, G, and B) of the colors R, G, and B form one basic unit so as to constitute a display unit pixel 41. In addition, each sub pixel 40 (R, G, or B) is configured to include an organic EL element 17 (R, C, or B) corresponding to red light emission (R), green light emission (C), or blue light emission (B) in correspondence with operations of the TFTs 122 and 123 (see FIG. 1). Since the organic EL element 17B has a short life cycle at the current state, the organic EL element 17B has a width that is twice that of the organic EL element 17 (R or G). Here, the "width" will be defined. The plane shape of the organic EL element 17 has a longitudinal direction and a lateral direction, and the lateral direction is defined as the widthwise direction. When the organic EL elements 17 (R, C, and B) emit light with brightness assorted, a load per unit area of the organic EL element 17B can be decreased by half. Accordingly, the life characteristic of the organic EL element can be improved.

According to this embodiment, a pixel portion 3 (denoted by a dashed-dotted line in the figure) is partitioned into an actual display area 4 on the center portion (within a range denoted by a dashed-two dotted line in the figure) and a dummy area 5 (an area between the dashed-dotted line and a dashed-two dotted line) which is arranged on the periphery of the actual display area 4. In addition, on both sides of the actual display area 4 in FIG. 2, the scanning line driving circuit 80 is disposed. This scanning line driving circuit 80 is disposed to be positioned on the lower side of the dummy area 5.

In addition, on the upper side in the actual display area 4 shown in FIG. 2, a test circuit 90 is disposed. This test circuit 90 is installed to be disposed on the lower side of the dummy area 5. This test circuit 90 is a circuit for testing the operation state of the organic EL panel 1. For example, the test circuit 90 includes a test information outputting unit (not shown) that outputs a test result externally and is configured to be able to test the quality and defect of the organic EL panel in the middle of a manufacture process or at the time of shipment.

Method of Manufacturing Organic EL Panel

Hereinafter, the organic EL panel according to this embodiment will be described with reference to the accompanying drawings. FIGS. 3A to 3C, FIGS. 4A to 4C, and FIG. 5 are schematic cross-section views showing a process of manufacturing the organic EL elements 17 (R, G, and B) shown in FIG. 2. Hereinafter, a method of manufacturing the organic EL element will be described with reference to the drawings.

Figure 3A:
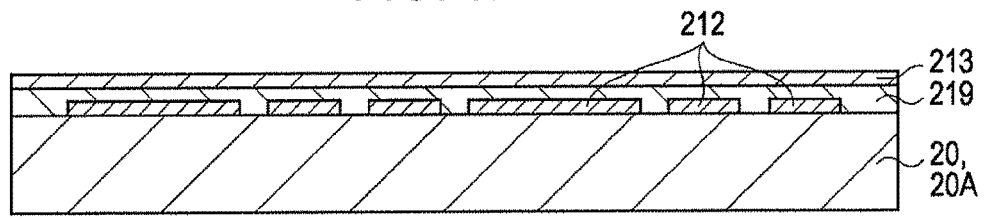
FIGS. 3A to 3C are schematic cross-section views showing a process of manufacturing organic EL elements (R, X, and B) according to an embodiment of the invention.

First, as shown in FIG. 3A, in a substrate main body 20A (see FIG. 2), on a substrate 20 in which the TFTs 122 and 123 (see FIG. 1) and the like are formed, a transparent anode 212 is formed by using ITO or the like. As a method of forming the transparent anode 212, a vapor deposition method is used so as to perform pattern formation by using an evaporation mask. Alternatively, instead of this process, after evaporating the entire surface of the substrate 20 at once, a pattern may be formed by using a photolithographic process so as to form the anode 212. Furthermore, instead of the vapor deposition method, a sputtering method or the like may be used appropriately. In consideration of electric resistance, optical transparency, and the like, as the thickness of the anode 212, for example, about 100 nm is appropriate. Subsequently, a hole injection layer 219 and a hole transport layer 213 are formed by using a vapor deposition method for the entire surfaces. The hole injection layer 219 is configured by HI406 (manufactured by Idemitsu Kosan Co., Ltd) and is controlled to have a layer thickness of about 30 nm. In addition, the hole transport layer 213 is configured by HT320 (manufactured by Idemitsu Kosan Co., Ltd) and is controlled to have a layer thickness of about 20 nm.

Figure 3B:
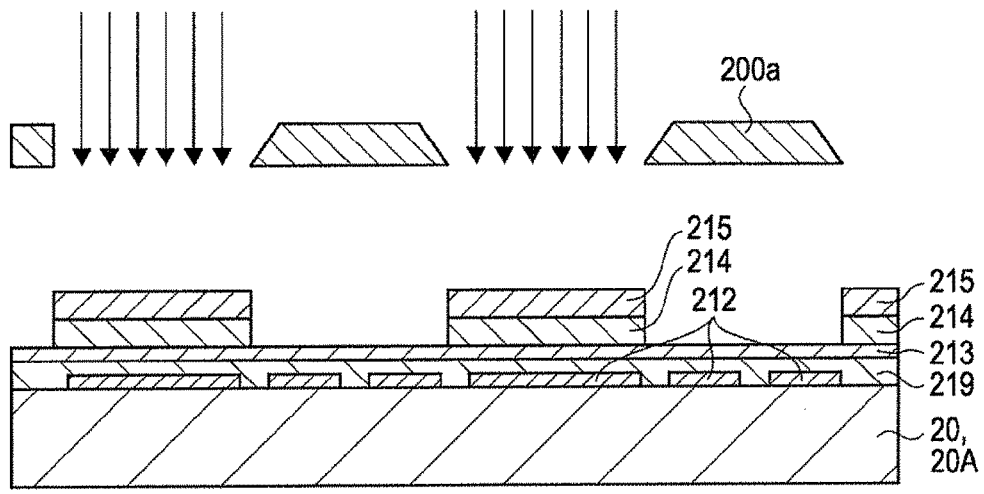

Next, as shown in FIG. 3B, first, an organic FL element 17B (see FIG. 1) of a blue color as a first color is formed. In particular, by using an evaporation mask 200a, which has an opening pattern, of the organic EL element 17B, a material containing ADN+BD052 (5%) (both manufactured by Idemitsu Kosan Co., Ltd) is evaporated so as to form a layer thickness of about 30 nm. Subsequently, by evaporating a layer having a layer thickness of about 20 nm by using Alq3 without removing the evaporation mask 200a, a first light emitting part 214 that is formed by using ADN+BD052 and Alq3 is formed. Subsequently, lithium fluoride (LiF) and aluminum (Al) that configure a cathode 215 of the organic EL element 17B (to be described later) are formed to have layer thicknesses of about 0.5 nm and 200 nm.

Figure 3C:
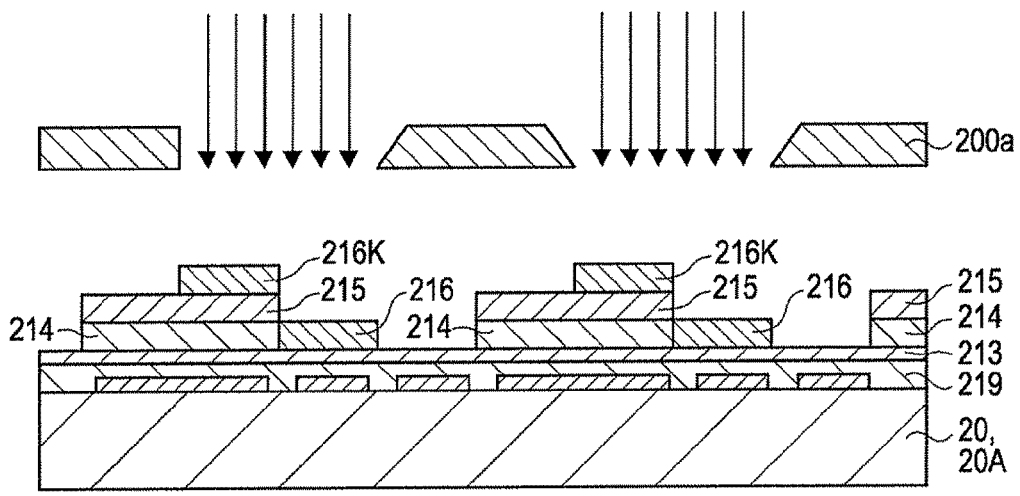

Next, as shown in FIG. 3C, the cathode 215 and the opening portion of the evaporation mask 200a are disposed to be partially overlapped with each other by shifting the position of the evaporation mask 200a, so that the evaporation mask 200a is disposed so as to form a desired width on the substrate 20. In such a case, although the width of the evaporation mask 200a may be deviated due to attachment of a deposition material, however, precision of implementation can be improved by performing alignment for correcting the deviated width portion. Accordingly, the amount of light emission of a second light emitting part 216 can be formed with excellent implementation. Then, Alq3+quinacridone (1%) is mask-evaporated to have a layer thickness of about 30 nm. Subsequently, by evaporating Alq3 to have a layer thickness of about 20 nm without removing the evaporation mask 200a, the second light emitting part 216 including "ALq3+quinacridone" and Alq3 which emits light of a green color as a second color is formed. In addition, by performing this process, an organic function layer 216K is incidentally generated on the cathode 215.

Figure 6A:
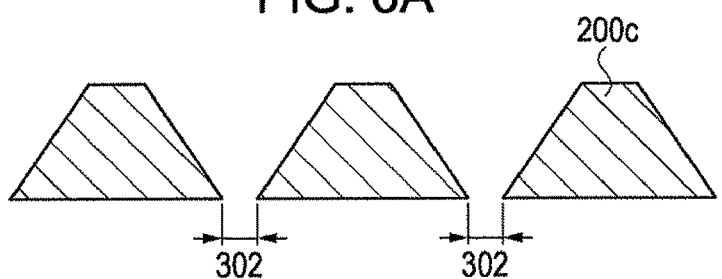
FIG. 6A is a cross-section view of an evaporation mask having a narrow width.
Figure 6B:
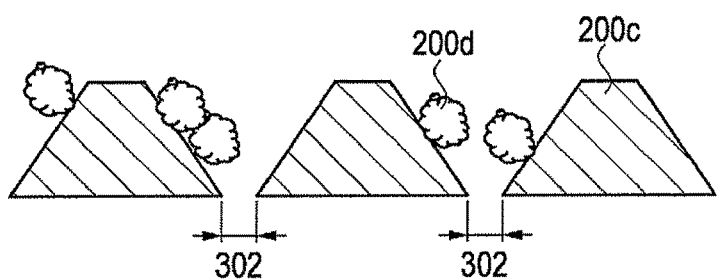
FIG. 6B is a cross-section view showing a state after the evaporation mask is used.
Figure 6C:
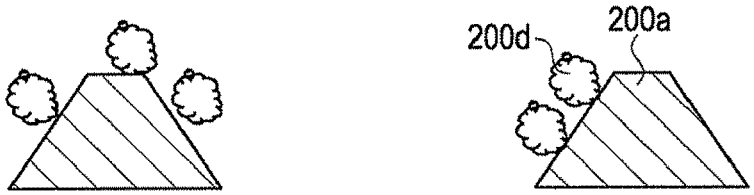
FIG. 6C is a cross-section view showing a state after an evaporation mask having a broad width is used, according to an embodiment of the invention.

Here, a case where an evaporation mask 200c having an opening portion of a short width is used and a case where a part of the evaporation mask 200a is formed to be overlapped with an adjacent electrode which is represented in this embodiment will be compared with reference to FIGS. 6A to 6C. FIG. 6A is a cross-section view of the evaporation mask 200c having a narrow width, FIG. 6B is a cross-section view showing a state after the evaporation mask 200c having the narrow width is used as a mask. In addition, FIG. 6C is a cross-section view showing a state after the evaporation mask 200a having a broad width is used as a mask.

Generally, when an evaporation mask is formed, it is preferable that the evaporation mask has a shape for not blocking penetration of incoming particles from an oblique direction. In particular, it is preferable that the evaporation mask has a taper shape that becomes narrower toward a side on which a substrate for evaporation is positioned. For this shape, various solving methods have been proposed. However, basically, a method that uses a process, in which anisotropic wet etching is performed for a single-crystal silicon substrate by using KOH aqueous solution, as a major process is frequently used.

When such a taper shape is applied to the evaporation mask 200c having a mask pattern of a small width, a non-opening state or an excessive opening state occurs frequently. When wet etching is performed for forming the evaporation mask 200c, time management for a sum of an etching time in a non-opening state and an etching time after formation of an opening is needed. In a case where an etching time (t2) after formation of the opening is short with respect to the etching time (t1) in the non-opening time, when the etching speed increases by "δ", the amount of etching changes by δ(t1+t2). Thus, an error corresponding to δt1 is added to the variation of the width of the mask pattern that is formed in accordance with the time t2. Accordingly, it becomes more difficult to control of the width of the mask pattern.

In order to stop the etching process in a state having a microscopic width, the density, the temperature, the etching time, and the like of the etching solution is needed to be managed precisely. Accordingly, formation of the evaporation mask 200c having a minute width decreases the yield ratio, and thus, it is not preferable.

On the other hand, as shown in FIG. 6C, in a case where the evaporation mask 200a having an opening portion of a large width is formed, an error corresponding to δt1 becomes negligible with respect to the total error. Accordingly, compared to a case where the evaporation mask 200c having an opening portion of a small width is formed, a relative error of the width is suppressed to be small. Accordingly, the evaporation mask 200a having a stable width of the opening portion for a slight deviation of the etching condition can be acquired.

In addition, as shown in FIG. 6B, after the evaporation mask 200c is used as a mask, there is a case where the opening portion 302 is closed due to attachment of incoming particles 200d. In such a case, the evaporation mask 200c is needed to be cleaned and used. However, when a cleaning operation is performed frequently, the operating rate of the evaporation mask 200c is decreased. Thus, the frequent cleaning operation becomes a factor for increasing the cost. In addition, waste liquid due to cleaning solutions for the evaporation mask is generated much. Accordingly, there is a problem that resources and energy are needed for processing the waste liquid.

On the other hand, as shown in FIG. 6C, when the evaporation mask 200a having the opening portion of a large width is used, the opening portion becomes narrower due to attachment of the incoming particles 200d, which is not quite different from the above-described case. However, by performing alignment for an area for evaporation by moving the evaporation mask 220a parallel, a decrease in the aperture ratio accompanied by attachment of the incoming particles 200d can be corrected.

Here, description will be returned back to the description of the method of manufacturing the organic EL panel.

Figure 4A:
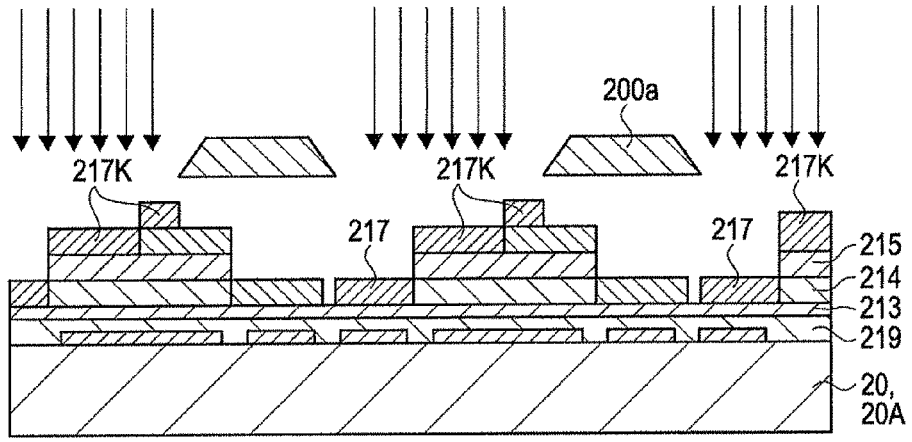
FIGS. 4A to 4C are schematic cross-section views showing a process of manufacturing organic EL elements (R, G, and B) according to an embodiment of the invention.

Next, as shown in FIG. 4A, the position of the evaporation mask 200a is shifted to a side opposite to the second light emitting part 216 to be disposed such that the cathode 215 and the opening portion of the evaporation mask 200a are partially overlapped with each other. In such a case, there is a case where misalignment of the width of the evaporation mark 200a due to attachment of the deposition material is generated. However, by performing alignment for correcting this misaligned width portion, implemented precision in the widthwise direction can be improved. Then, Alq3+DCJT (1%) (manufactured by Idemitsu Kosan Co., Ltd) is mask-evaporated so as to form a layer thickness of about 30 nm. Subsequently, without removing the evaporation mask 200a, Alq3 is evaporated so as to form a layer thickness of about 20 nm, and a third light emitting part 217, which includes Alq3+DCJT and Alq3, that emits red light as a third color is formed. In addition, by performing this process, an organic function layer 217K is incidentally formed on the cathode 215.

Up to the above-described process, a process for evaporating the evaporation mask 200a with the position thereof shifted for correcting the dimensional variation due to attachment of the deposition material is used. Thus, even when the deposition material is attached to the evaporation mask 200a, the accuracy of dimension can be maintained, and accordingly, the frequency of performing the cleaning process for the evaporation mask 200a can be decreased. Accordingly, the operating rate of the evaporation mask 200a can be improved. In addition, since the evaporation mask 200a is used for a plurality of processes, the operating ratio of the evaporation mask 200a can be increased further. Accordingly, the price depreciation of the evaporation mask 200a can be performed in a short period.

In addition, compared to a case where a pattern adjusted to the opening diameters of the second light emitting part 216 and the third light emitting part 217 is used, occurrence of defects that are caused by the variation of dimension due to attachment of the incoming particles can be suppressed.

In addition, since the second light emitting part 216 and the third light emitting part 217 have microscopic pattern dimensions, positional adjustment (alignment) is needed to be performed precisely for a case where a mask having a narrow opening portion as general technology is used. Accordingly, in such a case, when the positional adjustment is insufficient, the variation of characteristics increases. Compared with such a case, in a case where evaporation is performed with the cathode 215 and the opening portion of the evaporation mask 200a are disposed to be partially overlapped with each other, even when misalignment occurs more or less, only a phenomenon, in which color balance slightly changes, occurs. The color balance is a characteristic that can be easily adjusted, and accordingly, a method of manufacturing the organic EL panel 1 (see FIG. 1) which has a high yield ratio can be provided.

In addition, in the above-described embodiment, the evaporation mask 200a is used for manufacturing the first light emitting part 214, the second light emitting part 216, and the third light emitting part 217. However, at least one evaporation mask between the evaporation masks that are used for forming the second light emitting part 216 and the third light emitting part 217 may be configured to have a large opening portion.

Figure 4B:
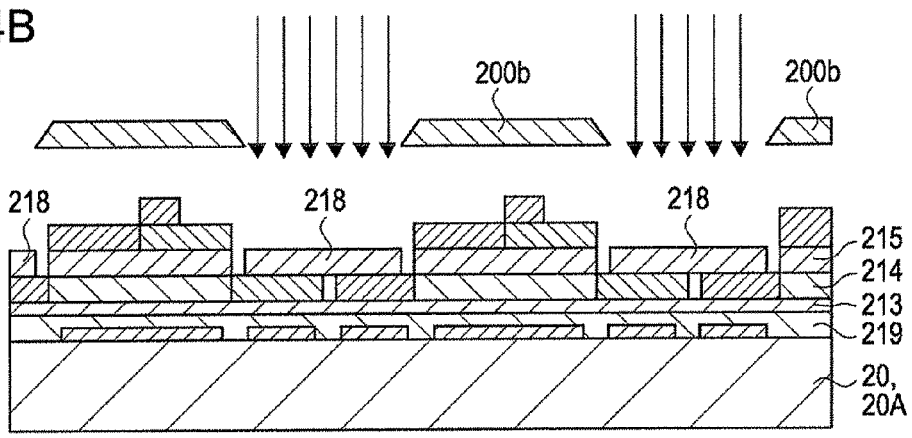

Next, as shown in FIG. 4B, LiF/Al layers configuring the cathode 218 that covers the second light emitting part 216 and the third light emitting part 217 are formed to have layer thicknesses of about 0.5 nm/200 nm by using the evaporation mask 200b.

Figure 4C:
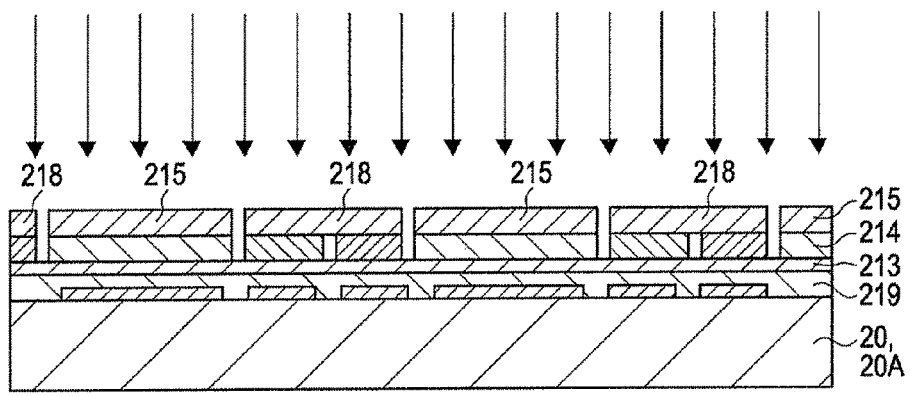

Next, as shown in FIG. 4C, Ar ashing is performed by using the cathode 215 and the cathode 218 as masks, and whereby the organic function layer 216K and the organic function layer 217K that are incidentally generated on the cathode 215 are removed. By performing ashing in the atmosphere of Ar, compared to a case where atmosphere of oxygen or the like is used, damages occurring to the cathode 215 and the cathode 218 can be suppressed.

Figure 5:
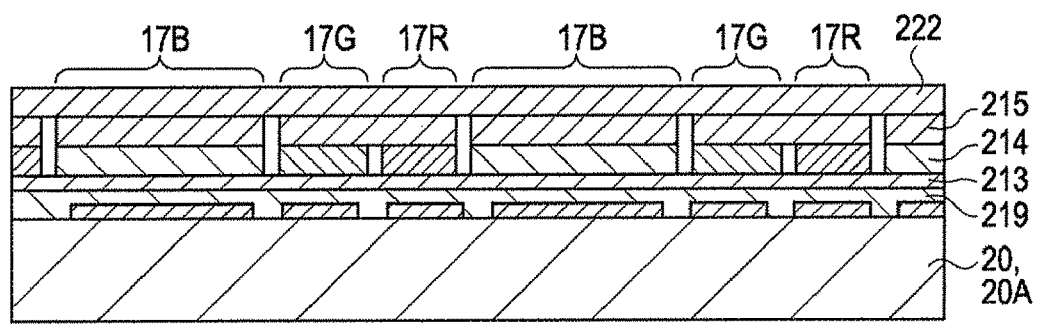
FIG. 5 is a schematic cross-section view showing a process of manufacturing organic EL elements (R, C, and B) according to an embodiment of the invention.

Next, as shown in FIG. 5, by depositing a cathode 222 so as to connect the cathode 215 and the cathode 218, the organic EL element 17B, an organic EL element 17G, and an organic EL element 17R are formed.

After completing the above-described processes, the organic EL panel 1 shown in FIG. 2 can be acquired by performing a panelizing operation by using a general process. In this embodiment, a method of lamination by using a vapor deposition method has been described. However, the incoming particles may be generated by using a method such as a method using plasma for generating the incoming particles other then the vapor deposition method.

Electronic Apparatus

Figure 7A:
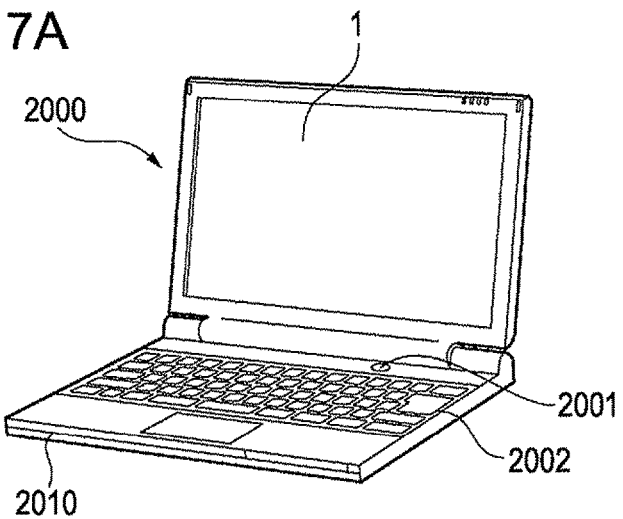
FIG. 7A shows the configuration of a mobile-type personal computer including the organic EL panel.

Hereinafter, electronic apparatuses including the above-described organic EL panel 1 will be described with reference to FIGS. 7A to 7C. FIG. 7A shows the configuration of a mobile-type personal computer including the organic EL panel 1. The personal computer 2000 includes the organic EL panel 1 and a main body part 2010. In the main body part 2010, a power switch 2001 and a keyboard 2002 are disposed.

Figure 7B:
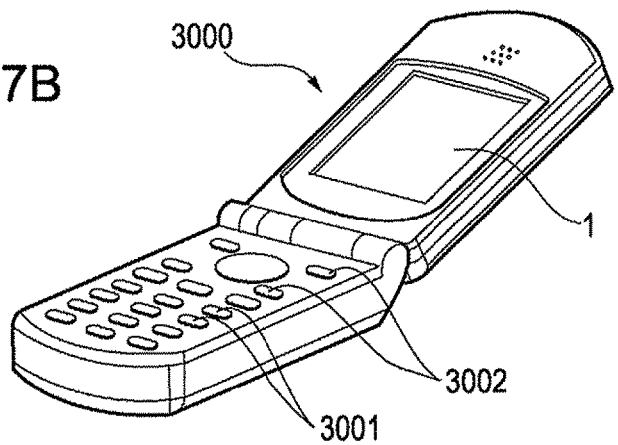
FIG. 7B shows the configuration of a cellular phone.

FIG. 7B shows the configuration of a cellular phone including the organic EL panel 1. The cellular phone 3000 includes a plurality of operation buttons 3001, scroll buttons 3002, and the organic EL panel 1 as a display unit. By operating the scroll button 3002, a screen displayed in the organic EL panel 1 is scrolled.

Figure 7C:
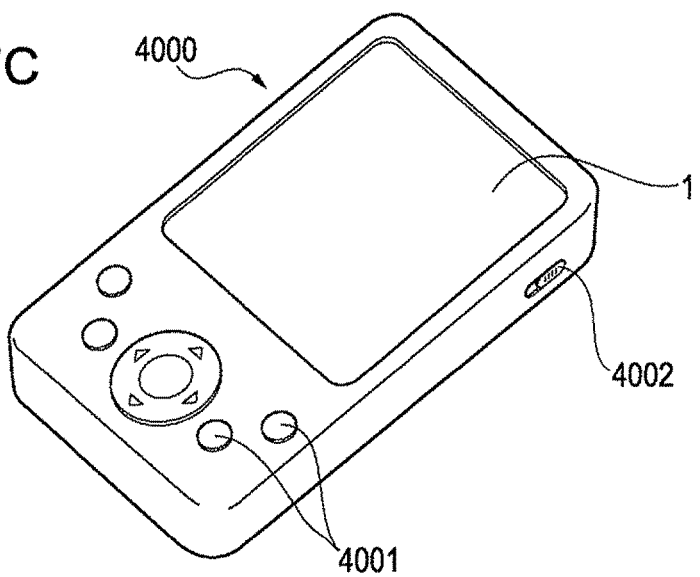
FIG. 7C shows the configuration of a personal digital assistants.

FIG. 7C shows the configuration of a personal digital assistants (PDA) to which the organic EL panel 1 is applied. The personal digital assistants 4000 includes a plurality of operation buttons 4001, a power switch 4002, and the organic EL panel 1 as a display unit. When the power switch 4002 is operated, various types of information such as an address book and a scheduling book are displayed in the organic EL panel 1.

In addition, as examples of electronic apparatuses in which the organic EL panel 1 is mounted, there are a digital still camera, a liquid crystal television set, a view finder-type and monitor direct viewing-type video cassette recorders, a car navigation system, an electronic organizer, a calculator, a word processor, a workstation, a video phone, a POS terminal, an apparatus having a touch panel, and the like other than the electronic apparatuses shown in FIGS. 7A to 7C. As display units of these electronic apparatuses, the above-described organic EL panel 1 can be used. In addition, the organic EL panel 1 may be applied to an in-vehicle car navigation system or an instrument panel by utilizing the wide viewing angle, the high image quality, and the high image-movement following capability of the organic EL panel 1.

The entire disclosure of Japanese Patent Application No. 2008-099069, filed Apr. 7, 2008 is expressly incorporated by reference herein.

What is claimed is:

1. A method of manufacturing an organic EL panel by using a mask that includes a blocking portion blocking incoming particles and a plurality of opening portions through which the incoming particles can pass, the method comprising:
    forming a first light emitting part corresponding to a first color on a substrate by using a first mask;
    forming a first electrode that is overlapped with the first light emitting part by using the first mask;
    forming a second light emitting part corresponding to a second color on the substrate next to the first light emitting part so as to cover at least a part of the first electrode by using a second mask;
    forming a third light emitting part corresponding to a third color on the substrate in a position for facing the second light emitting part with the first electrode interposed therebetween in the plan view so as to cover at least a part of the first electrode or the second light emitting part, by using a third mask;
    forming a second electrode in an area corresponding to the second light emitting part and the third light emitting part by using a fourth mask; and
    removing a material that is deposited on the first electrode and the second electrode by using the first electrode and the second electrode as a mask.

2. The method according to claim 1, wherein, after removing of the material, forming a conductive body layer in a superimposing manner so as to cover the first electrode and the second electrode.

3. The method according to claim 1,
    wherein the first light emitting part, the second light emitting part, and the third light emitting part have a shape that has a longitudinal direction and a lateral direction in the plan view, and
    wherein the first light emitting part, the second light emitting part, and the third light emitting part are arranged in the lateral direction.

4. The method according to claim 3, wherein the width of the first light emitting part is larger than both widths of the second light emitting part and the third light emitting part in a case where the lateral direction is assumed to be the widthwise direction.

5. The method according to claim 1, wherein the first mask, the second mask, and the third mask are masks that are formed as a same mask or formed by assorting dimensions thereof.

6. The method according to claim 3, wherein at least one between the second mask and the third mask has a width of an opening portion that is broader than that of the first mask in a case where the lateral direction is assumed to be the widthwise direction.

7. The method according to claim 1, wherein the removing of the material is performed by ashing using noble gas.

8. The method according to claim 1, wherein at least one between the second mask and the third mask performs alignment by correcting a dimensional variation due to a material attached to an end portion of the mask.

* * * * *